(12) United States Patent
Huang et al.

(10) Patent No.: US 10,031,353 B2
(45) Date of Patent: Jul. 24, 2018

(54) CIRCUITS WITH DELAY TAP LINES

(71) Applicant: Hewlett Packard Enterprise Development LP, Houston, TX (US)

(72) Inventors: Tsung-Ching Huang, Palo Alto, CA (US); Chin-Hui Chen, Palo Alto, CA (US); Marco Fiorentino, Mountain View, CA (US); Raymond G. Beausoleil, Seattle, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/272,856

(22) Filed: Sep. 22, 2016

(65) Prior Publication Data

US 2018/0081203 A1 Mar. 22, 2018

(51) Int. Cl.
| | |
|---|---|
| *H03K 3/00* | (2006.01) |
| *G02F 1/01* | (2006.01) |
| *H03K 5/06* | (2006.01) |
| *G02F 1/025* | (2006.01) |
| *H03K 5/00* | (2006.01) |
| *H04B 10/69* | (2013.01) |

(52) U.S. Cl.
CPC ............ *G02F 1/0121* (2013.01); *G02F 1/025* (2013.01); *H03K 5/06* (2013.01); *H03K 2005/00019* (2013.01); *H04B 10/69* (2013.01)

(58) Field of Classification Search
CPC ......... G02F 1/0121; G02F 1/025; H03K 5/06; H04B 10/69; H03L 2005/00019
See application file for complete search history.

(56) References Cited

U.S. PATENT DOCUMENTS

| | | | | |
|---|---|---|---|---|
| 5,285,477 | A * | 2/1994 | Leonowich | H04L 12/40 327/110 |
| 6,972,607 | B1 * | 12/2005 | Chen | G06F 1/04 327/291 |
| 7,109,759 | B2 | 9/2006 | Tseng | |
| 7,383,373 | B1 * | 6/2008 | Strickland | G06F 1/04 326/30 |
| 7,443,211 | B2 * | 10/2008 | Liu | H03K 5/1534 326/30 |
| 7,515,144 | B2 | 4/2009 | Lapstun et al. | |
| 7,598,779 | B1 * | 10/2009 | Wang | H03K 19/01852 327/108 |
| 7,868,653 | B2 * | 1/2011 | Komaki | H04L 25/0278 326/30 |
| 7,888,968 | B2 | 2/2011 | Dreps et al. | |

(Continued)

*Primary Examiner* — Kenneth B Wells
(74) *Attorney, Agent, or Firm* — Tarolli, Sundheim, Covell & Tummino L.L.P.

(57) ABSTRACT

Examples described herein relate to a driver circuit. In an example, the circuit includes a first input for receiving a first signal and a second input for receiving a second signal that is an inverse of the first signal. The circuit also includes a first driver array electrically coupling the first input to a first DC isolator and a first delay tap line electrically coupling the second input to the first DC isolator. The circuit further includes a second driver array electrically coupling the second input to a second DC isolator and a second delay tap line electrically coupling the first input to the second DC isolator. A carrier controller of the circuit is electrically coupled between the first DC isolator and the second DC isolator.

19 Claims, 7 Drawing Sheets

(56) References Cited

U.S. PATENT DOCUMENTS

| | | | |
|---|---|---|---|
| 8,054,102 B2 * | 11/2011 | Yi | H03K 19/01750 |
| | | | 326/83 |
| 8,131,157 B2 | 3/2012 | Heismann et al. | |
| 8,975,914 B2 * | 3/2015 | Mills | H03K 19/003 |
| | | | 326/21 |
| 9,128,308 B1 | 9/2015 | Zortman et al. | |
| 2011/0058765 A1 | 3/2011 | Xu | |

* cited by examiner

CIRCUITS WITH DELAY TAP LINES

GOVERNMENT LICENSE RIGHTS

This invention was made with Government support under Agreement Number H98230-14-3-0011. The Government has certain rights in the invention.

BACKGROUND

Optical communication techniques transmit data using signals such as infrared light, visible light, ultraviolet light, and other optical carrier signals, and are used in high-speed networks as well as in interfaces between components of a single system. In some of these techniques, transmitted data may be encoded by modulating an attribute of the carrier signal using an optical modulator. One particular class of optical modulator includes ring modulators.

A ring modulator may have a linear waveguide in close proximity to a substantially circular resonator, another type of waveguide. When an optical carrier signal is applied to the linear waveguide, optical coupling may cause a portion of the signal to be transferred to the resonator. Optical coupling may also cause the optical signal in the resonator to be transferred back to the linear waveguide. Thus, the output at the far end of the linear waveguide may depend on the interference between the portion of the carrier signal that flows straight through the linear waveguide and the portion that is diverted into and back out of the resonator. To encode a data signal, the ring modulator may include a mechanism that affects the behavior of the signal portion in the resonator, which affects how it interferes with the signal portion that remains in the linear waveguide. In turn, this affects the amplitude of the output signal.

BRIEF DESCRIPTION OF THE DRAWINGS

Certain examples are described in the following detailed description with reference to the drawings, of which.

DETAILED DESCRIPTION OF SPECIFIC EXAMPLES

Figure 1:
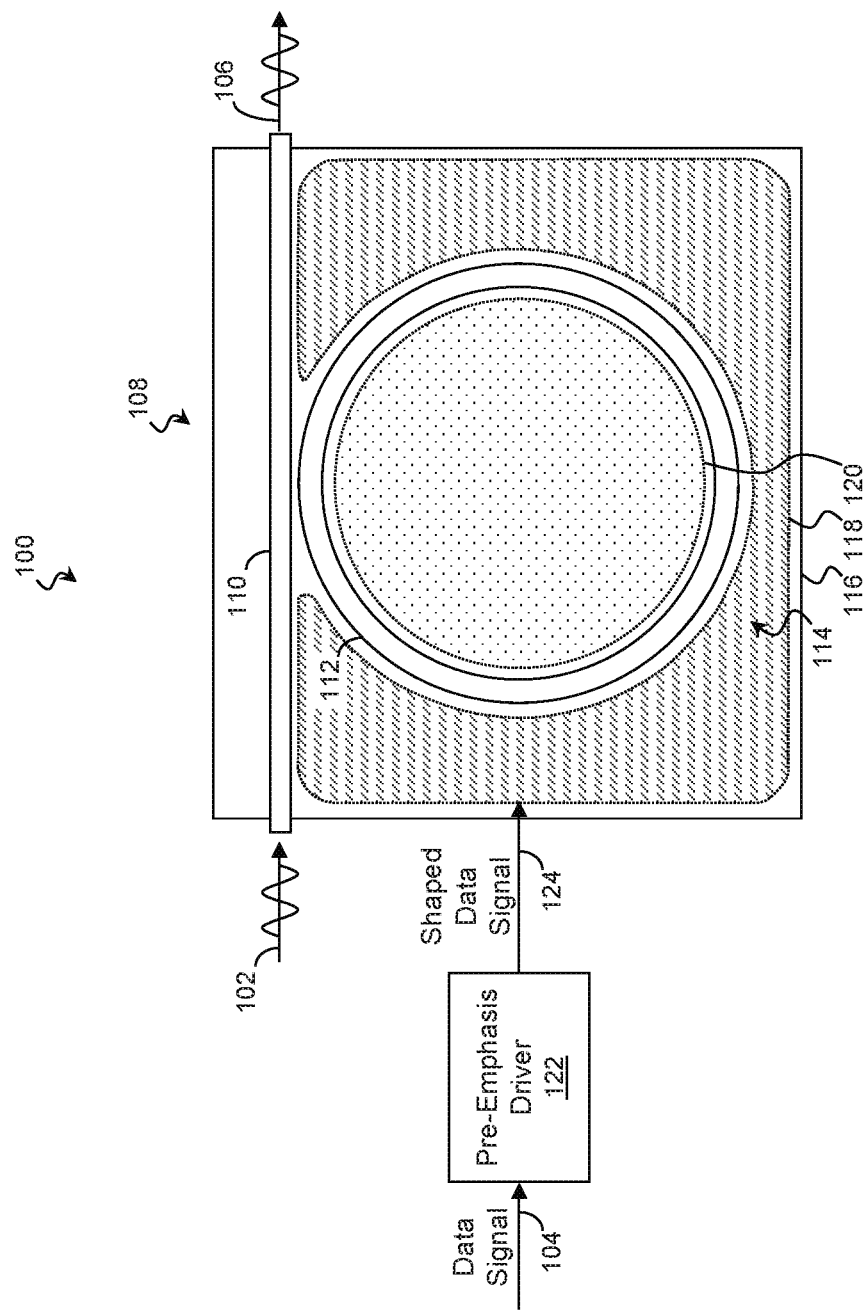
FIG. 1 is a block diagram of an optical communication circuit according to some examples of the present disclosure.

Optical communication provides for the rapid transfer of data with high throughput, low latency, and low line losses. Optical protocols are used to network computer systems and to connect computer systems to peripherals or other components. Data to be transmitted may be encoded by modulating attributes (e.g., amplitude, phase, wavelength, polarization, and/or other attributes) of an optical carrier signal (e.g., infrared light, visible light, ultraviolet light, etc.). Various devices may be used to encode data in the optical carrier signal, and in some examples, a ring modulator is used.

It has been determined that a bit rate of a ring modulator can be improved by shaping the data signal prior to supplying it to the ring modulator, and some examples of the present disclosure provide a device that includes a ring modulator and a driver to shape the data signal based on a frequency response of the modulator. For example, the frequency response of some ring modulators to a data signal falls off at certain frequencies. To account for this, in some examples, a pre-emphasis driver amplifies these frequencies in the data signal prior to supplying the data signal to the modulator. As a result of the amplification, the combined frequency response of the driver and modulator may be made more uniform. This may provide better signal integrity along an optical fiber and at the receiver and may allow higher bitrate communications.

In some examples, the pre-emphasis driver receives the data signal to be shaped as a differential pair. In such examples, the pre-emphasis driver includes a first driver array and a first delay tap line to sum a first signal of the differential pair (e.g., the non-inverted data signal) with a delayed version of the second signal (e.g., the inverted data signal). Similarly, the pre-emphasis driver may include a second driver array and a second delay tap line to sum the second signal of the differential pair with a delayed version of the first signal. The first and second summed signals emphasize certain frequencies in the data signal based on the delays applied by the first delay tap line and the second delay tap line. Accordingly, the delays are selected so that the first and second summed signals compensate for the frequency response of the ring modulator. In this way, the combined frequency response of the pre-emphasis driver and modulator may have extended bandwidth and thereby support higher bitrates.

In some examples, the pre-emphasis driver includes multiple parallel delay tap lines. For example, the pre-emphasis driver may include a plurality of delay tap lines that apply different amounts of delay to the second input signal of the differential pair so that the first input signal is summed with a plurality of delayed versions of the second signal at different delays. Similarly, the pre-emphasis driver may include a plurality of delay tap lines that delay the first signal to sum the second signal with a plurality of delayed versions of the first signal. Including parallel delay tap lines allows the pre-emphasis driver to have a more complex frequency response and provides greater control over the frequency ranges that are amplified.

In some examples, each of the delay tap lines includes multiple parallel gated drivers. Each gated driver may be individually enabled or disabled. This allows the drive strength of the delay tap line to be adjusted, which affects the frequency response of the pre-emphasis driver. As with the parallel delay tap lines, gated drivers allow the pre-emphasis driver to have a more complex frequency response and provide greater control over the frequency ranges that are amplified. By decoupling unused drivers from power and/or ground, some examples avoid parasitic energy losses from unused drivers and provide a more energy-efficient device.

In some examples, in order to electrically isolate the driver arrays and the delay tap lines from a controller that controls the resonator, the pre-emphasis driver includes a DC isolator between the first summed signal and the controller and another DC isolator between the second summed signal and the controller. The DC isolators may include a high-pass filter and a voltage divider. In this way, the DC isolators may allow the driver arrays and the delay tap lines to be operated at a different voltage than the controller.

The circuitry and techniques of the present disclosure provide optical communication with improved signal integrity which may be due in part to a more uniform frequency response. In turn, this may allow communication at higher bit rates with fewer errors. By these mechanisms and others, the present disclosure provides substantial real world improvements to optical communication. For instance, in some examples, the pre-emphasis driver includes multiple delay tap lines arranged electrically in parallel to provide a more comprehensive frequency response and greater control over those frequency ranges that are amplified. In some examples, the delay tap lines of the pre-emphasis driver include parallel gated drivers with independent enable signals to provide further control over the frequency response. In some examples, the pre-emphasis driver includes DC isolators that separate the DC operating voltages and allow the amplifying circuitry to be operated at a lower voltage than the controller for the resonator to save energy and to improve circuit reliability.

These examples and others are described with reference to the following figures. Unless noted otherwise, these figures and their accompanying description are non-limiting, and no element is characteristic of any particular example. In that regard, features from one example may be freely incorporated into other examples without departing from the spirit and scope of the disclosure.

FIG. 1 is a block diagram of an optical communication circuit 100 according to some examples of the present disclosure. The optical communication circuit 100 receives an optical carrier signal 102 (e.g., coherent or incoherent infrared light, visible light, ultraviolet light, etc.) and a data signal 104. The optical communication circuit 100 encodes data from the data signal 104 in the optical carrier signal 102 by modulating attributes of the carrier signal 102 such as amplitude, phase, wavelength, polarization, and/or other attributes to produce an optical output signal 106 containing the data from the data signal 104. The data may be encoded and packetized in any form, and accordingly, the optical communication circuit 100 is suitable for use with any suitable optical protocol.

The optical communication circuit 100 may include an optical modulator such as a ring modulator 108 to encode the data signal 104 in the carrier signal 102. In turn, the ring modulator 108 may include a linear waveguide 110 in proximity to a resonator 112 (e.g., a substantially circular waveguiding structure). The linear waveguide 110 and the resonator 112 may each include optical fibers, rectangular waveguides, and/or other waveguiding structures to direct an optical signal along the waveguide. In some examples, the linear waveguide 110 and/or the resonator 112 includes an inner core material such as a semiconductor, silicate or fluoride glass, plastic, or other suitable material and a cladding material surrounding the inner core material. The cladding material may have a higher refractive index than the material of the inner core so that the difference in refractive index channels an optical signal along a length of the waveguide via internal reflection.

The linear waveguide 110 and the resonator 112 may be arranged close enough to have an optical coupling effect between the two. In that regard, when the linear waveguide 110 receives the carrier signal 102, some portion of the signal is directed into the resonator 112. The circumference and optical density of the resonator 112 may be configured so that the carrier signal 102 constructively interferes with itself each time it cycles inside the resonator 112. Accordingly, the circumference of the resonator 112 may be selected based on the wavelength of the carrier signal 102 to be used in the resonator 112.

The optical coupling may also cause some portion of the signal in the resonator 112 to be directed back out into the linear waveguide 110. This portion may interfere with the portion of the carrier signal that remains in the linear waveguide 110 to produce the output signal 106. When the two portions destructively interfere, the output signal 106 may have a lower amplitude than the carrier signal 102 (e.g., an amplitude substantially equal to zero). In contrast, when the two portions constructively interfere, the output signal 106 may have an amplitude substantially equal to that of the carrier signal 102.

In order to change the behavior of the resonator 112 to switch between destructive and constructive interference, the modulator 108 may include an active device 114 adjacent to the resonator 112. The flow of carriers (e.g., electrons or holes) through the active device 114 may affect the optical density of the resonator 112 material. For a given frequency of light, the optical density of a medium affects the wavelength of the light, and for a given resonator 112 circumference, the wavelength affects how the light will interfere in the resonator 112 and in the linear waveguide 110. It follows that the flow of carriers through the active device 114 may be used to affect optical density of the resonator 112 and thus the amplitude of the output signal 106. This provides a mechanism for modulating the output signal 106 in response to the data signal 104.

Accordingly, the resonator 112 may be formed on a substrate 116 that contains the active device 114. The substrate 116 may include any suitable materials, and in various examples, the substrate 116 includes a single-element-crystalline semiconductor (e.g., doped or undoped silicon, germanium, etc.), a compound semiconductor (e.g., doped or undoped SiGe, GaAs, other III-V semiconductors, etc.), a dielectric (e.g., a semiconductor oxide, a semiconductor nitride, a semiconductor oxynitride, a semiconductor carbide, etc.), a metal, a metal alloy, a metal silicide, and/or other suitable materials.

Portions of the substrate 116 may be doped to define the active device 114. In some examples, the substrate 116 includes a first doped region 118 beyond the resonator 112 and a second doped region 120 encircled by the resonator 112. One of the regions 118 and 120 may be doped with an n-type dopant material such as phosphorous, antimony, and/or arsenic to form an n-type region, while the other may be doped with a p-type dopant material such as boron, aluminum, and/or gallium to form a p-type region. The doped regions 118 and 120 may be located and configured so that the flow of carriers between the doped regions 118 and 120 affects the optical response of the resonator 112.

Figure 2:
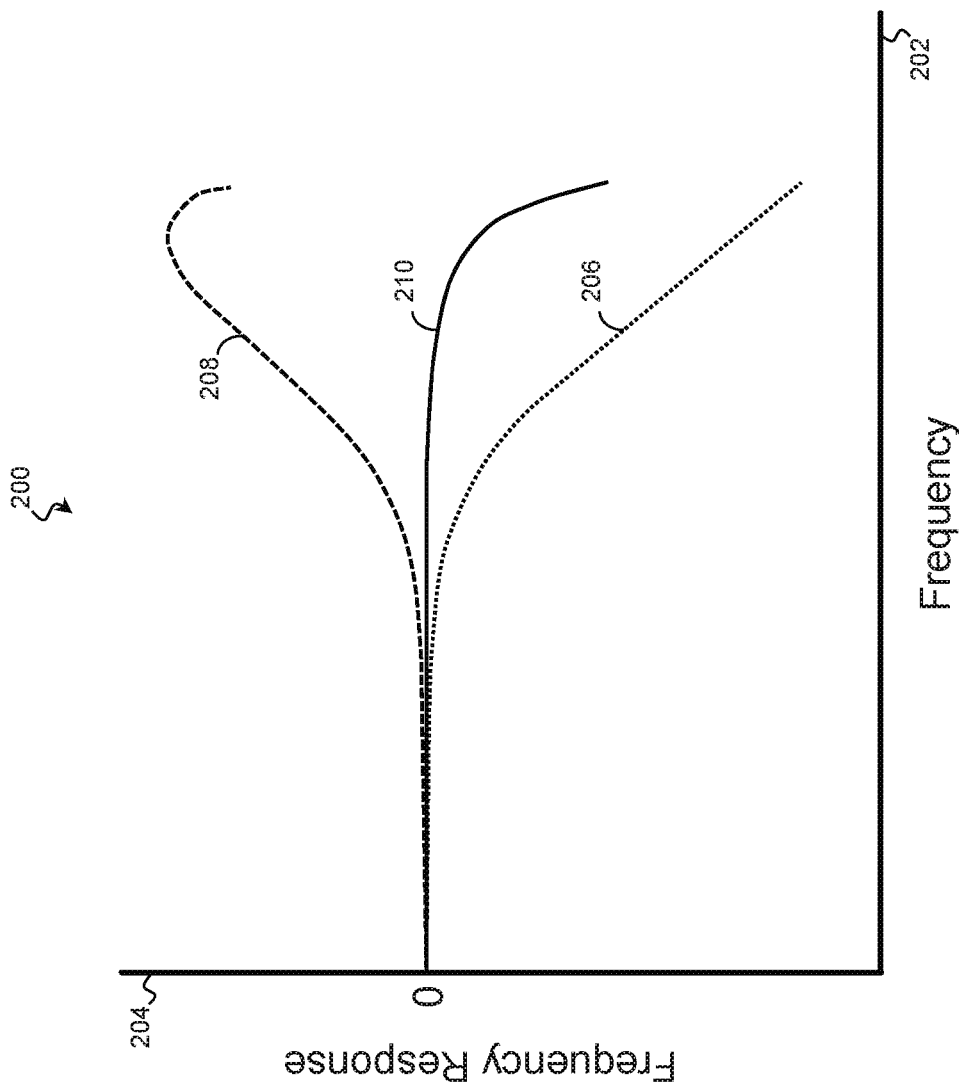
FIG. 2 is a plot of a frequency response of an optical communication circuit according to some examples of the present disclosure.

It has been determined that the response of the ring modulator 108 may not be uniform across all frequencies of the data signal 104. FIG. 2 is a plot 200 of a frequency response of an optical communication circuit 100 according to some examples of the present disclosure. Axis 202 represents frequency and is logarithmic, and axis 204 represents a frequency response as measured in decibels (dB).

Line 206 represents a response of one example of a ring modulator 108 to various frequencies in a data signal 104 to be encoded in a carrier signal 102. As can be seen, the response of the ring modulator 108 falls off after a certain frequency. This reduced sensitivity to high frequencies may limit the maximum bit rate of the data signal 104, because after a point, the ring modulator 108 may no longer accurately represent the data signal 104.

To remedy this, the data signal 104 may first be provided to a pre-emphasis driver 122. The pre-emphasis driver 122 amplifies certain frequencies within the data signal 104. Line 208 represents a response of one example of a pre-emphasis driver 122. The amplification of the pre-emphasis driver 122 may cause the overall optical communication circuit 100 (the combination of the pre-emphasis driver 122 and the ring modulator 108) to have a more uniform frequency response across a wider range of frequencies as shown by line 210. This may allow for faster data bit rates and reduced errors.

Accordingly, referring back to FIG. 1, the optical communication circuit 100 includes a pre-emphasis driver 122 in line with the ring modulator 108. The pre-emphasis driver 122 receives the data signal 104 and amplifies selected frequency ranges to produce a shaped data signal 124 that is provided to the ring modulator 108. In this way, the pre-emphasis driver may increase the uniformity of the frequency response and enable faster data rates. Examples of suitable pre-emphasis drivers 122 are described with reference to FIGS. 3-6.

Figure 3:
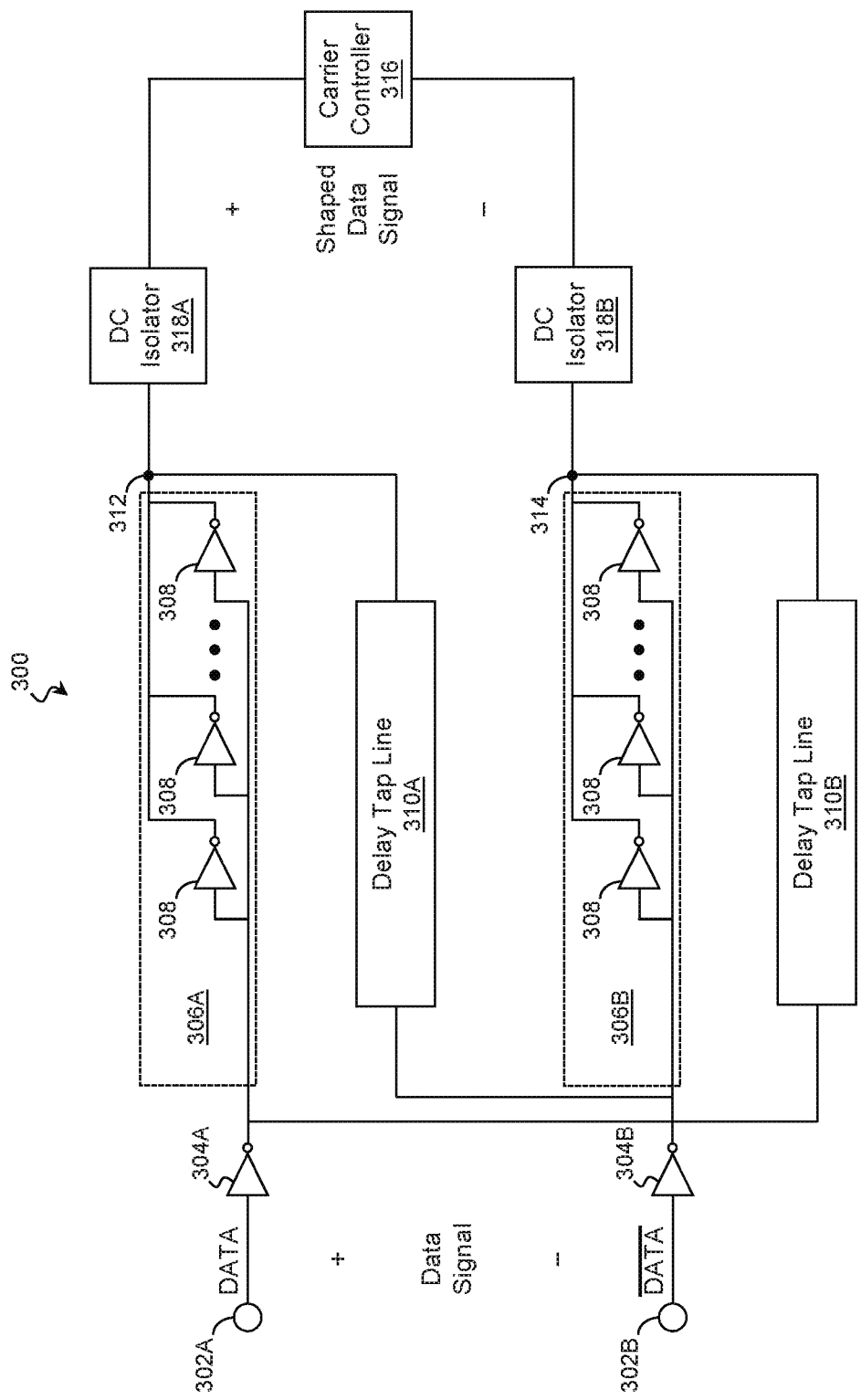
FIG. 3 is a block circuit diagram of a pre-emphasis driver that includes DC isolators according to some examples of the present disclosure.

Referring first to FIG. 3, illustrated is a pre-emphasis driver 300 that includes DC isolators according to some examples of the present disclosure. The pre-emphasis driver 300 is suitable for use in the pre-emphasis driver 122 of FIG.

The pre-emphasis driver 300 may include a pair of input terminals 302A and 302B to receive data (e.g., the data signal 104 of FIG. 1) as a pair of differential signals. Accordingly, in the illustrated examples, a first input terminal 302A receives a first data signal, while a second input terminal 302B receives a second data signal that is the inverse of the first data signal. An assist driver (e.g., assist drivers 304A and 304B) may be electrically coupled to each of the input terminals.

The pre-emphasis driver 300 may include a first driver array 306A electrically coupled to the first input terminal 302A by way of the first assist driver 304A. The first driver array 306A may include any number (including one) of drivers 308 electrically coupled in parallel to drive and/or amplify the first data signal. The pre-emphasis driver 300 may include a first delay tap line 310A that is electrically coupled to the second input terminal 302B by way of the second assist driver 304B to provide a time-delayed version of the second data signal. The outputs of the first driver array 306A and the first delay tap line 310A are combined so that the signal at node 312 is the sum of the first data signal and the time-delayed second data signal.

The pre-emphasis driver 300 may also include a second driver array 306B electrically coupled to the second input terminal 302B by way of the second assist driver 304B. The second driver array 306B may include any number (including one) of drivers 308 electrically coupled in parallel to drive and/or amplify the second data signal. A second delay tap line 310B may drive and/or amplify a time-delayed version of the first data signal. The outputs of the second driver array 306B and the second delay tap line 310B are combined so that the signal at node 314 is the sum of the second data signal and the time-delayed first data signal.

The signals at nodes 312 and 314 may be used to drive a carrier controller 316. As the name implies, the carrier controller 316 controls the flow of carriers through an active device such as the active device 114 used to control the ring resonator 112 as described in the context of FIG. 1. The carrier controller 316 may include a carrier injector and/or a carrier depletion device, and a voltage applied across the carrier controller 316 may increase the flow of carriers or decrease the flow of carriers through the active device 114. As explained above, the flow of carrier through the active device 114 may have a direct effect on the output signal 106. Accordingly, in some such examples, the voltage across the carrier controller 316 affects an attribute, such as amplitude, of an output signal 106 produced by the optical communication circuit 100 of FIG. 1.

DC isolators may be used to couple the summed signals at nodes 312 and 314 to the carrier controller 316. In some examples, a first DC isolator 318A electrically couples the first driver array 306A and the first delay tap line 310A to a first terminal of the carrier controller 316, and a second DC isolator 318B electrically couples the second driver array 306B and the second delay tap line 310B to a second terminal of the carrier controller 316. The DC isolators 318A and 318B may act as high-pass filters to pass transitions in the signals at nodes 312 and 314 to the carrier controller 316 while allowing the driver arrays 306A and 306B and the delay tap lines 310A and 310B to operate at a different voltage from the carrier controller 316. Accordingly, in some examples, the driver arrays 306A and 306B and the delay tap lines 310A and 310B operate at a first voltage while the carrier controller 316 operates at a second, different, voltage. In some such examples, the DC isolators 318A and 318B provide the voltage for the carrier controller 316. This may reduce the load on the drivers 308 and may allow smaller, more efficient, drivers 308 to be used in the driver arrays 306A and 306B and the delay tap lines 310A and 310B. In this way, the DC isolators 318A and 318B may provide isolation for the amplification portion of the pre-emphasis driver and proper DC biasing of the carrier controller 316.

Figure 4:
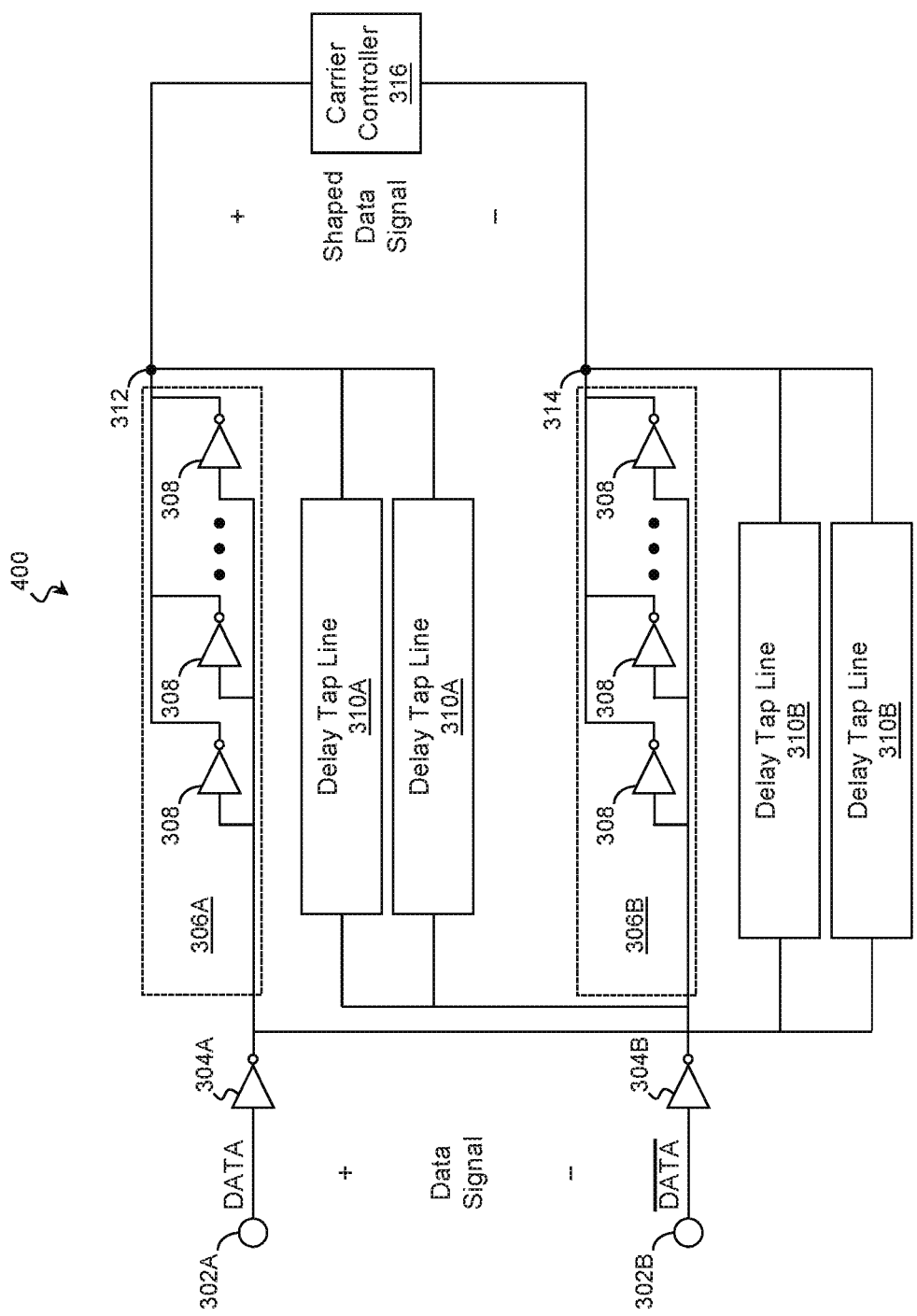
FIG. 4 is a block circuit diagram of a pre-emphasis driver that includes a plurality of parallel delay tap lines according to some examples of the present disclosure.

Further examples of the pre-emphasis driver are described with reference to FIG. 4. In that regard, FIG. 4 is a block circuit diagram of a pre-emphasis driver 400 that includes a plurality of parallel delay tap lines according to some examples of the present disclosure. The pre-emphasis driver 400 may be substantially similar to the pre-emphasis driver 300 of FIG. 3 in many aspects and is suitable for use in the pre-emphasis driver 122 of FIG. 1.

The pre-emphasis driver 400 may include a pair of input terminals 302A and 302B to receive data (e.g., the data signal 104 of FIG. 1) as a pair of differential signals. Accordingly, in the illustrated examples, a first input terminal 302A receives a first data signal, while a second input terminal 302B receives a second data signal that is the inverse of the first data signal.

The pre-emphasis driver 400 may include a first driver array 306A electrically coupled to the first input terminal 302A (via a first assist driver 304A) and a second driver array 306B electrically coupled to the second input terminal 302B (via a second assist driver 304B). The first driver array 306A and the second driver array 306B may each include any number (including one) of drivers 308 electrically coupled in parallel to drive and/or amplify the first data signal and second data signal, respectively.

The pre-emphasis driver 400 may also include a plurality of delay tap lines electrically coupled to the first input terminal 302A and the second input terminal 302B to provide time-delayed versions of the first data signal and the second data signal, respectively. For example, a first set of delay tap lines (each indicated by reference number 310A and applying an independent amount of delay) may be electrically coupled in parallel to the second input terminal 302B via the second assist driver 304B, and a second set of delay tap lines (each indicated by the reference number 310B and applying an independent amount of delay) may be electrically coupled in parallel to the first input terminal 302A via the first assist driver 304A. The pre-emphasis driver 400 may include any number of delay tap lines 310A and 310B, of which, two each are shown, and each delay tap line may apply a different and independent amount of delay.

The outputs of the delay tap lines are summed with the outputs of the driver arrays as described above and used to drive a carrier controller 316. In that regard, the first set of delay tap lines 310A is electrically coupled to the first driver array 306A and a first terminal of the carrier controller 316 at node 312. The second set of delay tap lines 310B is electrically coupled to the second driver array 306B and a second terminal of the carrier controller 316 at node 314.

Including a plurality of independent parallel delay tap lines allows the pre-emphasis driver 400 to have a more comprehensive frequency response because it combines an undelayed signal with more than one delayed version of the converse signal. The independent delays of the delay tap lines 310A and 310B may be used to control the relationship between the data signal and the shaped data signal. In some examples, the delays of the delay tap lines 310A and 310B are selected to produce a frequency response with a particular peak shape (e.g., square, triangular, sawtooth, etc.) and peak width. Likewise in some examples, the delays of the delay tap lines 310A and 310B are selected to produce a frequency response with multiple peaks.

Figure 5:
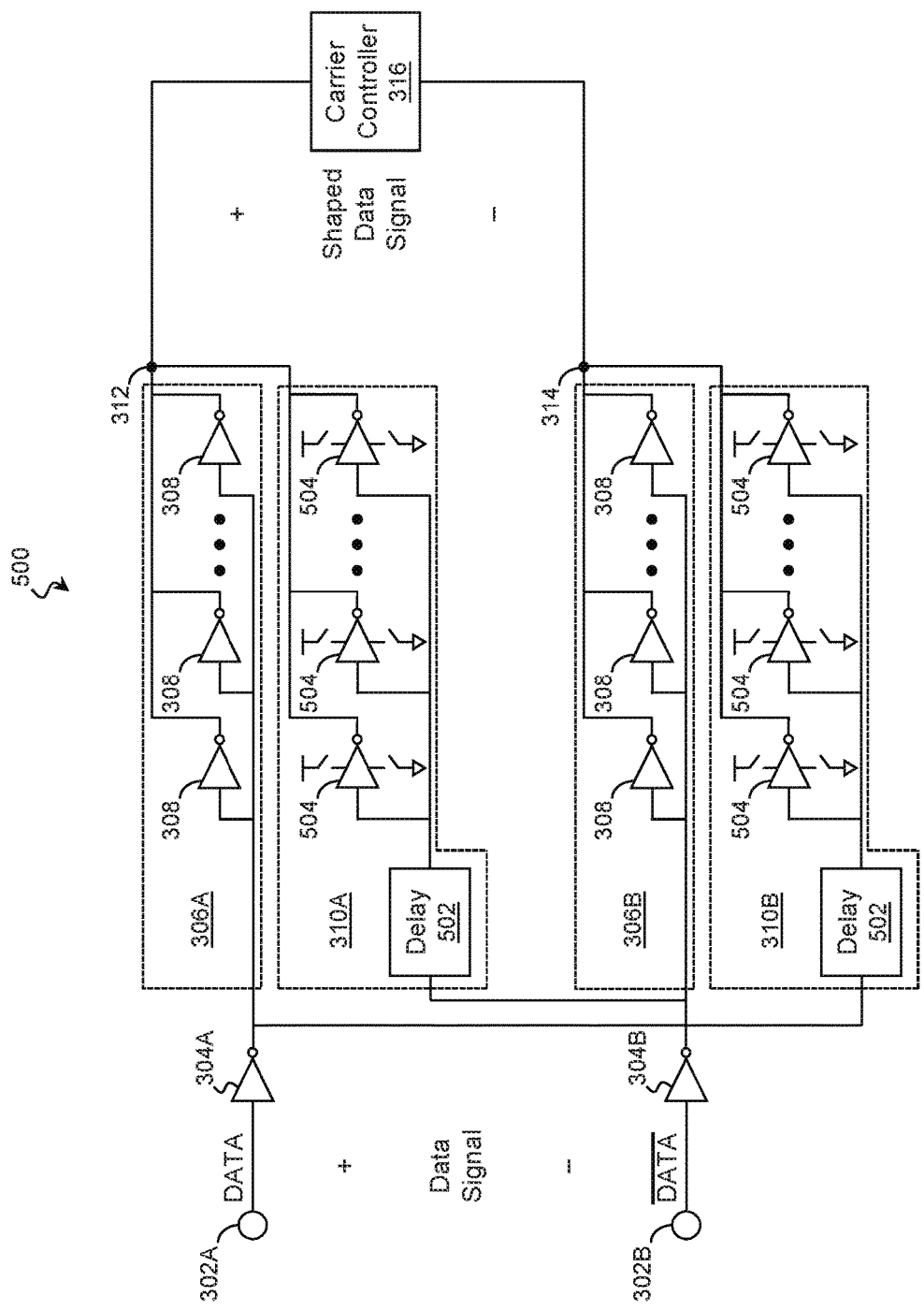
FIG. 5 is a block circuit diagram of a pre-emphasis driver that includes gated drivers according to some examples of the present disclosure.

Referring next to FIG. 5, illustrated is a pre-emphasis driver 500 that includes gated drivers according to some examples of the present disclosure. The pre-emphasis driver 500 may be substantially similar to the pre-emphasis driver 300 of FIG. 3 and/or pre-emphasis driver 400 of FIG. 4 in many aspects and is suitable for use in the pre-emphasis driver 122 of FIG. 1.

The pre-emphasis driver 500 may include a pair of input terminals 302A and 302B to receive data (e.g., the data signal 104 of FIG. 1) as a pair of differential signals. Accordingly, in the illustrated examples, a first input terminal 302A receives a first data signal, while a second input terminal 302B receives a second data signal that is the inverse of the first data signal.

The pre-emphasis driver 500 may include a first driver array 306A electrically coupled to the first input terminal 302A (via a first assist driver 304A) and a second driver array 306B electrically coupled to the second input terminal 302B (via a second assist driver 304B). The first driver array 306A and the second driver array 306B may each include any number (including one) of drivers 308 electrically coupled in parallel to drive and/or amplify the first data signal and second data signal, respectively.

The pre-emphasis driver 500 may also include a first delay tap line 310A electrically coupled to the second input terminal 302B via a second assist driver 304B and a second delay tap line 310B electrically coupled to the first input terminal 302A via a first assist driver 304A. Each of the delay tap lines 310A and 310B may include an independent delay element 502 to control the amount of delay applied. An output of each delay element 502 may be provided to a set of gated drivers 504 electrically coupled in parallel to drive and/or amplify the delayed signal. Each set of gated drivers 504 may contain any number of gated drivers 504 (including one), and to control the overall drive strength and pre-emphasis frequency response, each gated driver 504 may have an independent gating mechanism. In some examples, the gating mechanism power-gates the driver 504 by coupling or decoupling the gated driver 504 to a power supply or ground. Decoupling the gated driver 504 rather than merely gating an input or output may avoid leakage current and other parasitic effects associated with a disabled driver 504 and thereby increase the efficiency of the pre-emphasis driver 500. This may result in a more energy-efficient circuit.

The gating mechanisms may be used to control the contribution of a delayed signal to the respective sum, and some or all of the gated drivers 504 may be enabled in order to increase the contribution of the delayed signal. Conversely, some or all of the gated drivers 504 may be disabled to decrease the contribution of the delayed signal. Controlling the number of enabled drivers 504 allows the pre-emphasis driver 500 to have a more comprehensive frequency response manipulation. In some examples, the number of enabled drivers 504 is selected to produce a frequency response with a particular peak shape and peak width. In these examples and others, the number of enabled drivers 504 in each delay tap line 310A and 310B is used to control the relationship between the data signal and the shaped data signal.

Figure 6:
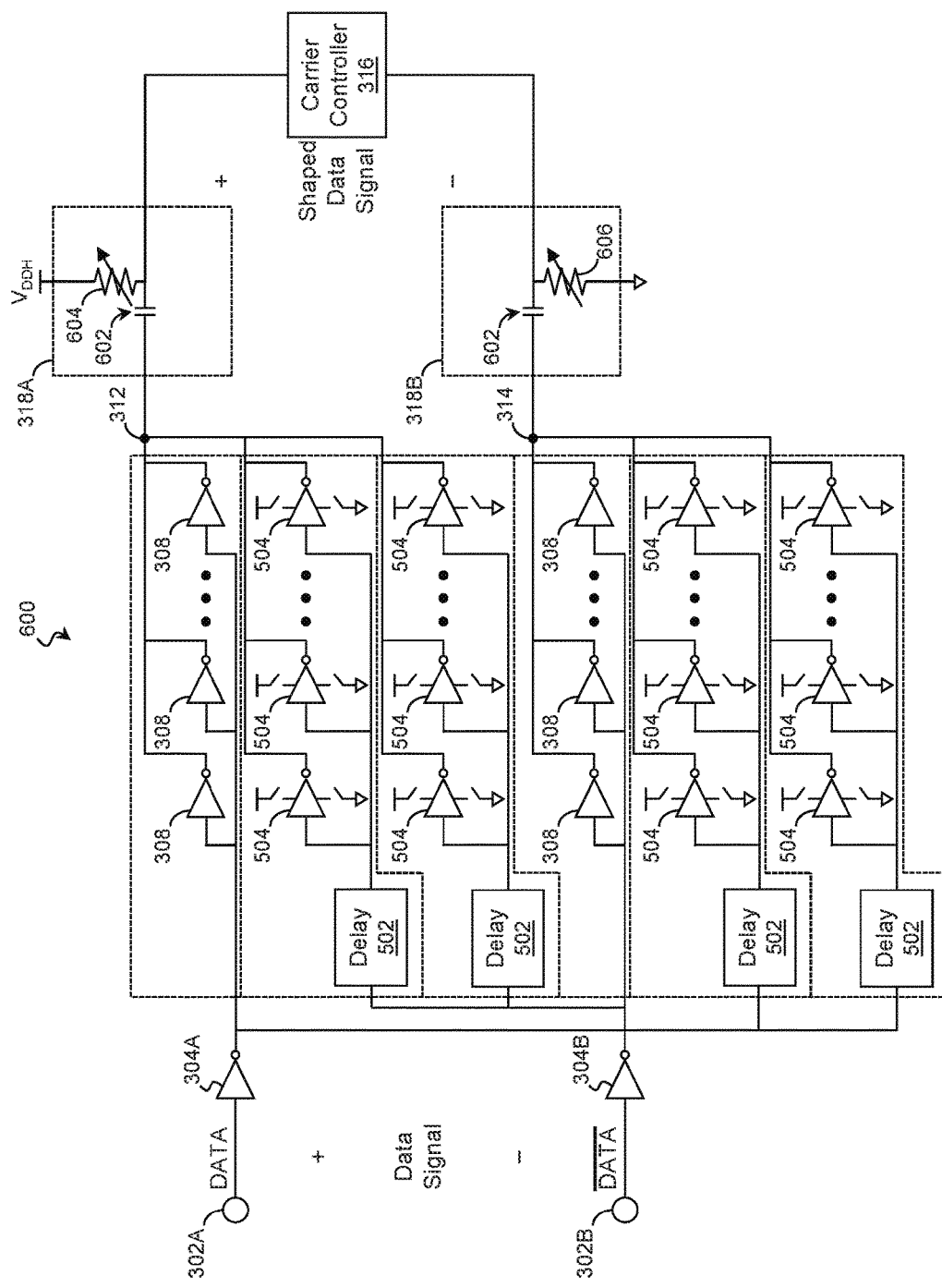
FIG. 6 is a block circuit diagram of a pre-emphasis driver according to some examples of the present disclosure.
Figure 7:
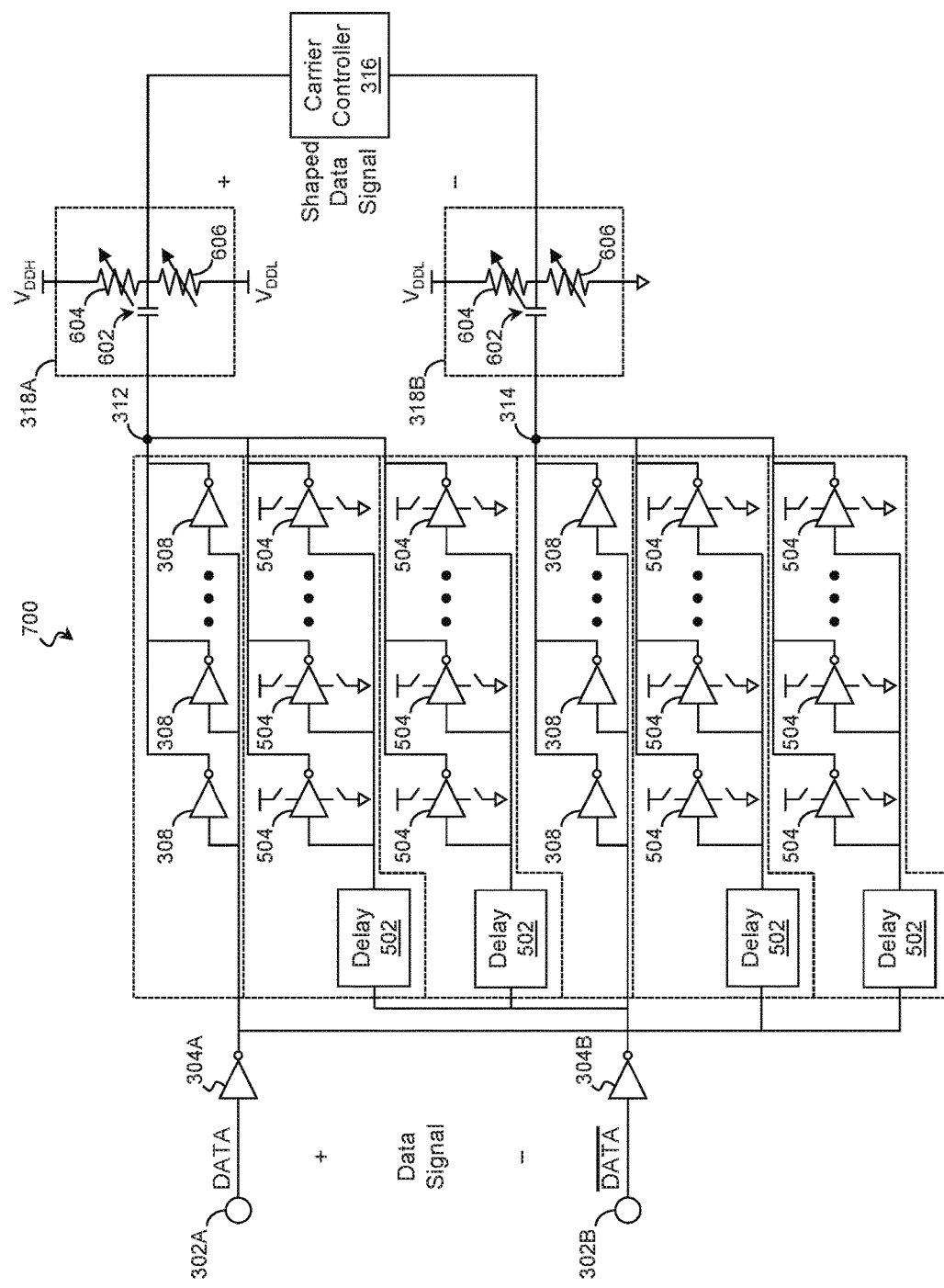
FIG. 7 is a block circuit diagram of a pre-emphasis driver according to some examples of the present disclosure.

Yet further examples are described with reference to FIGS. 6 and 7. FIG. 6 is a block circuit diagram of a pre-emphasis driver 600 according to some examples of the present disclosure, and FIG. 7 is a block circuit diagram of a pre-emphasis driver 700 according to some examples of the present disclosure. The pre-emphasis driver 600 and driver 700 may each be substantially similar to the pre-emphasis drivers 300, 400, and/or 500 of FIGS. 3-5 in many aspects and each is suitable for use in the pre-emphasis driver 122 of FIG. 1.

Referring first to FIG. 6, the pre-emphasis driver 600 may include a pair of input terminals 302A and 302B to receive data (e.g., the data signal 104 of FIG. 1) as a pair of differential signals. Accordingly, in the illustrated examples, a first input terminal 302A receives a first data signal, while a second input terminal 302B receives a second data signal that is the inverse of the first data signal.

The pre-emphasis driver 600 may include a first driver array 306A electrically coupled to the first input terminal 302A (via a first assist driver 304A) and a second driver array 306B electrically coupled to the second input terminal 302B (via a second assist driver 304B). The first driver array 306A and the second driver array 306B may each include any number (including one) of drivers 308 electrically coupled in parallel to drive and/or amplify the first data signal and second data signal, respectively.

The pre-emphasis driver 600 may also include a plurality of delay tap lines electrically coupled to the first input terminal 302A and the second input terminal 302B to provide time-delayed versions of the first data signal and the second data signal. For example, a first set of delay tap lines 310A is electrically coupled in parallel to the second input terminal 302B via the second assist driver 304B, and a second set of delay tap lines 310B is electrically coupled in parallel to the first input terminal 302A via the first assist driver 304A. The pre-emphasis driver 600 may include any number of delay tap lines 310A and 310B, of which, two each are shown.

Each delay tap line may include an independent delay element 502 to apply a different and independent amount of delay. An output of each delay element 502 may be provided to a set of gated drivers 504 electrically coupled in parallel to drive and/or amplify the delayed signal. Each set of gated drivers 504 may contain any number of gated drivers 504 (including one), and to control the overall drive strength, each gated driver 504 may have an independent gating mechanism. In some examples, the gating mechanism couples or decouples the gated driver 504 to a power supply or ground.

The outputs of the delay tap lines 310A and 310B are summed with the outputs of the driver arrays 306A and 306B such that the signal at node 312 is the sum of the first data signal and the time-delayed versions of the second data signal and the signal at node 314 is the sum of the second data signal and the time-delayed versions of the first data signal. DC isolators electrically couple the summed signals at nodes 312 and 314 to a carrier controller 316. In some examples, a first DC isolator 318A electrically couples node 312 to a first terminal of the carrier controller 316, and a second DC isolator 318B electrically couples node 314 to a second terminal of the carrier controller 316.

The DC isolators 318A and 318B may each include a capacitor 602 electrically coupled between a respective input node and a resistor to define a high-pass filter. Accordingly, the capacitance of the capacitor 602 and/or the resistance of the resistor may be selected, in part, based on a frequency range to be passed by the filter. The resistor may also provide power to the carrier controller 316. Accordingly, in some examples, the first DC isolator 318A includes a first resistive device 604 is coupled to a voltage supply for the carrier controller 316, $V_{DDH}$, and the second DC isolator 318B includes a second resistive device 606 coupled to a ground node. In this way, the DC isolators 318A and 318B allow the driver arrays 306A and 306B and the delay tap lines 310A and 310B to operate at a different voltage from the carrier controller 316. In some examples, to control the voltage applied to the carrier controller 316 either or both of the restive devices (e.g., resistive device 604 and/or 606) are tunable resistance devices.

Additionally or in the alternative, the DC isolators 318A and 318B may each include a voltage divider. For example, referring to FIG. 7, the pre-emphasis driver 700 is substantially similar to the driver 600 of FIG. 6, with the addition of a voltage divider to the DC isolators 318A and 318B. The voltage divider may be implemented by a first resistive device 604 electrically coupled between a first voltage source and the capacitor 602 and a second resistive device 606 electrically coupled between the capacitor 602 and a second voltage source. The voltage dividers may be electrically coupled such that, in the first DC isolator 318A, the first resistive device 604 is coupled to a voltage supply for the carrier controller 316, $V_{DDH}$, and the second resistive device 606 is coupled to an intermediate voltage, $V_{DDL}$. In the second DC isolator 318B of the example, the first resistive device 604 is coupled to $V_{DDL}$ and the second resistive device 606 is coupled to a ground node. The DC isolators 318A and 318B may act as high-pass filters to pass transitions in the signals at nodes 312 and 314 to the carrier controller 316 while allowing the driver arrays 306A and 306B and the delay tap lines 310A and 310B to operate at a different voltage from the carrier controller 316. In some examples, to control the voltage applied to the carrier controller 316, some or all of the restive devices (e.g., resistive devices 604 and/or 606) are tunable resistance devices.

In these examples and others, the pre-emphasis driver provides fine-grained control over the frequencies of the data signal that are amplified in order to account for the frequency response of a ring modulator 108 or other modulating device in a power efficient manner. In this way, the combined communication circuit may more accurately encode the data signal in the optical carrier signal. This may reduce data errors and allow the communication circuit to operate at higher bitrates.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A circuit comprising:
a first input for receiving a first signal;
a second input for receiving a second signal that is an inverse of the first signal;
a first driver array electrically coupling the first input to a first DC isolator;
a first delay line electrically coupling the second input to the first DC isolator;
a second driver array electrically coupling the second input to a second DC isolator;
a second delay line electrically coupling the first input to the second DC isolator;
a third delay line electrically coupling the second input to the first DC isolator, wherein a delay of the third delay line is independent of a delay of the first delay line;
a fourth delay line electrically coupling the first input to the second DC isolator, wherein a delay of the fourth delay line is independent of a delay of the second delay line; and
a carrier controller electrically coupled between the first DC isolator and the second DC isolator.

2. The circuit of claim 1, wherein the first DC isolator includes:
a first capacitor electrically coupled between a first node and each of the first driver array and the first delay line; and
a first resistor electrically coupled between a first voltage source and the first node, wherein the carrier controller is electrically coupled to the first node.

3. The circuit of claim 2, wherein the second DC isolator includes:
a second capacitor electrically coupled between a second node and each of the second driver array and the second delay line; and
a second resistor electrically coupled between the second node and a ground node, wherein the carrier controller is electrically coupled to the second node.

4. The circuit of claim 3, wherein the first DC isolator includes a third resistor electrically coupled between the first node and a second voltage source, and wherein the second DC isolator includes a fourth resistor electrically coupled between the second voltage source and the second node.

5. The circuit of claim 1,
wherein the first delay line includes:
a first tunable delay element electrically coupled to the second input; and
a third driver array electrically coupled between the first tunable delay element and the first DC isolator, and
wherein the second delay line includes:
a second tunable delay element electrically coupled to the first input; and
a fourth driver array electrically coupled between the second tunable delay element and the second DC isolator.

6. The circuit of claim 5, wherein the third driver array and the fourth driver array each include a gated driver having an independent gating mechanism.

7. The circuit of claim 1, wherein the carrier controller includes a device selected from a group consisting of: an optical ring modulator carrier injector and an optical ring modulator carrier depletion device.

8. A circuit comprising:
a plurality of differential inputs;
a first set of drivers electrically coupling a first input of the plurality of differential inputs to a first terminal of a carrier controller;
a second set of drivers electrically coupling a second input of the plurality of differential inputs to a second terminal of the carrier controller;
a first plurality of delay lines electrically coupling the second input to the first terminal; and
a second plurality of delay lines electrically coupling the first input to the second terminal.

9. The circuit of claim 8, wherein each delay line of the first plurality of delay lines and of the second plurality of delay lines includes:
a tunable delay element; and
a plurality of gated drivers, wherein each driver of the plurality has an independent gating mechanism.

10. The circuit of claim 9, wherein each tunable delay element is independently tunable.

11. The circuit of claim 8, wherein the first set of drivers and the first plurality of delay lines are electrically coupled to the first terminal by a first DC isolator; and wherein the second set of drivers and the second plurality of delay lines are electrically coupled to the second terminal by a second DC isolator.

12. The circuit of claim 11, wherein each of the first DC isolator and the second DC isolator includes a capacitor electrically coupled to a voltage divider that is electrically coupled to the carrier controller.

13. The circuit of claim 8, wherein the carrier controller includes a device selected from a group consisting of: an optical ring modulator carrier injector and an optical ring modulator carrier depletion device.

14. A circuit comprising:
a plurality of differential inputs;
a first set of drivers electrically coupling a first input of the plurality of differential inputs to a carrier controller;
a second set of drivers electrically coupling a second input of the plurality of differential inputs to the carrier controller;
a first delay line including a first set of gated drivers electrically coupling the second input of the plurality of differential inputs to an output of the first set of drivers, wherein gated drivers of the first set of gated drivers each have an independent gating mechanism;
a third set of drivers electrically coupling the second input of the plurality of differential inputs to the carrier controller; and
a second delay line including a second set of gated drivers electrically coupling the first input of the plurality of differential inputs to an output of the third set of drivers, wherein gated drivers of the second set of drivers each have an independent gating mechanism.

15. The circuit of claim 14, wherein each of the first delay line and the second delay line includes a tunable delay element.

16. The circuit of claim 14 comprising:
a third delay line electrically coupling the second input of the plurality of differential inputs to the output of the first set of drivers, wherein a delay of the third delay line is independent of a delay of the first delay line; and
a fourth delay line electrically coupling the first input of the plurality of differential inputs to the output of the second set of drivers, wherein a delay of the fourth delay line is independent of a delay of the second delay line.

17. The circuit of claim 14 comprising:
a first DC isolator electrically coupling the first set of drivers and the first delay line to the carrier controller; and
a second DC isolator electrically coupling the third set of drivers and the second delay line to the carrier controller.

18. The circuit of claim 17,
wherein the first DC isolator includes:
a first capacitor electrically coupling the first set of drivers and the first delay line to a first node;
a first resistor electrically coupled between a first voltage supply and the first node, and
wherein the second DC isolator includes:
a second capacitor electrically coupling the third set of drivers and the second delay line to a second node;
a second resistor electrically coupled between the second node and a ground node.

19. The circuit of claim 18, wherein the first DC isolator includes a third resistor electrically coupled between the first node and a second voltage supply, and wherein the second DC isolator includes a fourth resistor electrically coupled between the second voltage supply and the second node.

* * * * *